(12) United States Patent
Nam et al.

(10) Patent No.: US 7,183,214 B2
(45) Date of Patent: Feb. 27, 2007

(54) HIGH-DENSITY PLASMA (HDP) CHEMICAL VAPOR DEPOSITION (CVD) METHODS AND METHODS OF FABRICATING SEMICONDUCTOR DEVICES EMPLOYING THE SAME

(75) Inventors: Jeong-Hoon Nam, Gyeonggi-Do (KR); Jin-Ho Jeon, Gyeonggi-Do (KR)

(73) Assignee: Samsung Electronics Co., Lgd., Suwon-si (KR)

( * ) Notice: Subject to any disclaimer, the term of this patent is extended or adjusted under 35 U.S.C. 154(b) by 0 days.

(21) Appl. No.: 11/233,538

(22) Filed: Sep. 22, 2005

(65) Prior Publication Data

US 2006/0223321 A1    Oct. 5, 2006

(30) Foreign Application Priority Data

Mar. 29, 2005    (KR) .................. 10-2005-0026185

(51) Int. Cl.
*H01L 21/311*    (2006.01)
(52) U.S. Cl. .................. 438/694; 438/695; 438/728; 257/E21.23
(58) Field of Classification Search ................ 438/694, 438/695, 728
See application file for complete search history.

(56) References Cited

U.S. PATENT DOCUMENTS

| 5,759,906 | A | * | 6/1998 | Lou | ................ 438/623 |
|---|---|---|---|---|---|
| 6,740,601 | B2 | | 5/2004 | Tan et al. | |
| 6,740,605 | B1 | * | 5/2004 | Shiraiwa et al. | ............ 438/795 |
| 6,846,745 | B1 | | 1/2005 | Papasouliotis et al. | |
| 2001/0019903 | A1 | | 9/2001 | Shufflebothanm et al. | |
| 2003/0162363 | A1 | | 8/2003 | Ji | |
| 2004/0178169 | A1 | * | 9/2004 | Desphande et al. | ........... 216/12 |
| 2004/0241929 | A1 | | 12/2004 | Radecker | |

FOREIGN PATENT DOCUMENTS

KR    10-2005-0002052    1/2005

OTHER PUBLICATIONS

Jörg Radecker, et al. "Extending the HDP-CVD Technology to the 90nm Node and Beyond with an In-Situ Etch Assisted (ISEA) HDP-CVD Process" IEEE, 2003 pp. 125-130.

* cited by examiner

*Primary Examiner*—Asok K. Sarkar
*Assistant Examiner*—Victor V. Yevsikov
(74) *Attorney, Agent, or Firm*—Marger Johnson & McCollom, P.C.

(57) ABSTRACT

In one embodiment, a semiconductor substrate is placed into a process chamber. A gas mixture including a silicon-containing gas, a fluorine-containing gas, an inert gas, and an oxygen gas is introduced into the chamber at a pressure range of from about 30 mTorr to about 90 mTorr. During this time, deposition and etching processes are concurrently performed using a plasma to form a high-density plasma (HDP) insulating layer on the semiconductor substrate. A ratio of deposition to etching is from about 3:1 to about 10:1. A ratio of a flow rate of the fluorine-containing gas to a flow rate of the silicon-containing gas is less than about 0.9.

10 Claims, 10 Drawing Sheets

(a) Pressure : 5 mTorr, Ratio of NF3/SiH4 : 1.0

(b) Pressure : 30 mTorr, Ratio of NF3/SiH4 : 0.88

(c) Pressure : 60 mTorr, Ratio of NF3/SiH4 : 0.77

(d) Pressure : 90 mTorr, Ratio of NF3/SiH4 : 0.64

HIGH-DENSITY PLASMA (HDP) CHEMICAL VAPOR DEPOSITION (CVD) METHODS AND METHODS OF FABRICATING SEMICONDUCTOR DEVICES EMPLOYING THE SAME

CROSS-REFERENCE TO RELATED APPLICATION

The present application claims the priority of Korean Patent Application No. 2005-26185, filed Mar. 29, 2005 in the Korean Intellectual Property Office. The disclosures of all of the above applications are incorporated herein in their entirety by reference.

BACKGROUND OF INVENTION

1. Field of the Invention

The present invention generally relates to the fields of semiconductor fabrication and, more particularly, to high-density plasma (HDP) chemical vapor deposition (CVD) methods and methods of forming semiconductor devices using the same.

2. Description of Related Art

For fabricating semiconductor devices, various processing steps are needed. In particular, chemical vapor deposition (CVD) processes are generally used to fill gaps such as spaces between adjacent raised structures such as transistor gates, conductive patterns, e.g. signal lines, trenches and the like with an insulating material.

As semiconductor device geometries have shrunken over the years, the CVD film's gap-fill capability, i.e., the ability to fill gaps without leaving voids, has become an important factor in the successful production of semiconductor devices. In particular, it has become increasingly difficult to fill narrow, high-aspect ratio gaps or recessed features due to the limitations of existing CVD techniques. This is because most CVD processes tend to deposit more material on the upper region than on the lower region of gap sidewalls and to form undesirable overhangs at the entry of the gap. As a result, the top portion of the high-aspect ratio gaps often closes prematurely leaving voids within the gaps. Such gaps degrade the device characteristics, for example, by trapping undesirable impurities within the gaps.

High-density plasma ("HDP") chemical vapor deposition (CVD) techniques have been emerged as the technology of choice for filling narrow, high-aspect ratio gaps due to its gap-filling capability. HDP-CVD systems form a plasma having a density that is approximately two orders of magnitude greater than the density of a standard, capacitively-coupled plasma CVD system.

However, the ratio between the heights of the gaps and their widths (the so-called aspect ratio) has continuously increased (e.g. greater than 3). This causes problems such as the formation of voids or reentrant features, e.g., a narrowing at the tops of the gaps. These problems have become a major challenge for successful production of more highly-integrated advanced semiconductor devices.

One approach that the semiconductor industry has developed to improve gap fill capability of the conventional HDP CVD methods is the use of a multi-step deposition and etching process. Such a process is often referred to as a deposition/etch/deposition (dep/etch/dep) process. The dep/etch/dep process divides the deposition of the gap-fill layer into two or more steps separated by a plasma etch step. The intermediate plasma etch step etches the first deposited film more at the upper corners of the film portion more than it does at the sidewalls and lower portions of the gap so that the second deposition step can fill the gap without prematurely closing it off. One such dep/etch/dep process is disclosed in U.S. Pat. No. 6,846,745 ("the '745 invention"). However, the process disclosed in the '745 invention is very complicated and time-consuming, which leads to low throughput. This throughput problem is exacerbated because the '745 invention requires that the substrate be moved to a clean reactor between successive deposition and etch operations for process stability. Further, with such conventional methods, gap-fill process margins are relatively narrow, with problems such as clipping (excessive etching) or voids within the filled gaps (excessive deposition).

As another attempt to improve the gap fill capability of the conventional HDP CVD methods, fluorine or fluorine compounds are added during the deposition process to improve gap fill. The fluorine in the form of free radicals acts as an etchant that works against the growth of material in the area of the trench openings. In other words, the free radicals chemically etch deposited material in the trench opening area. Consequently, the trenches can be filled with dielectric films from the bottom up without premature closing up of the trenches, leaving no voids therein (desirable bottom-up fill). For these reasons, in the prior art, the fluorine-containing gas flow rate has typically greater than the silicon source gas flow rate, e.g., greater than 1, for forming a silicon-oxide based gap-fill layer. This greater gas flow rate results in good gap-fill results because more fluorine species work against the growth of material in the area of the trench openings.

However, conventional HDP-CVD methods using fluorine-containing gas tend to incorporate an undesirable number of fluorine atoms that significantly degrade the device characteristics. For example, use of too many fluorine atoms can cause undesirable out-diffusion of fluorine atoms into the silicon substrate, delamination of layers and/or damage to silicon active regions. Attempts to overcome this problem by using a barrier layer to prevent out-diffusion of the fluorine atoms understandably complicates the overall manufacturing process, decreases throughput, and increases manufacturing costs.

Accordingly, what is needed is an improved high-density plasma (HDP) chemical vapor deposition (CVD) methods that overcomes such problems of the prior art.

SUMMARY

Embodiments of the present invention provide a method of improving gap fill capabilities and reducing the amount of fluorine atoms in gap-fill layers as compared to conventional HDP-CVD methods.

In one embodiment, a semiconductor substrate is placed into a process chamber. A gas mixture including a silicon-containing gas, a fluorine-containing gas, an inert gas, and an oxygen gas is introduced into the chamber at a pressure range of from about 30 mTorr to about 90 mTorr. During this time, deposition and etching processes are concurrently performed using a plasma to form a high-density plasma (HDP) insulating layer on the semiconductor substrate. A ratio of deposition to etching is from about 3:1 to about 10:1. A ratio of a flow rate of the fluorine-containing gas to a flow rate of the silicon-containing gas is less than about 0.9.

Accordingly, high aspect ratio gaps, e.g., trenches formed in a substrate are substantially completely filled with a dielectric without voids, using high-density plasma chemical vapor deposition (HDP-CVD) while significantly reducing fluorine atoms from the deposited insulation layer and the defects resulting therefrom.

BRIEF DESCRIPTION OF THE DRAWINGS

The aspects and advantages of the present invention will become more apparent with the detailed description of the exemplary embodiments with reference to the attached drawings.

DETAILED DESCRIPTION

Figure 1:
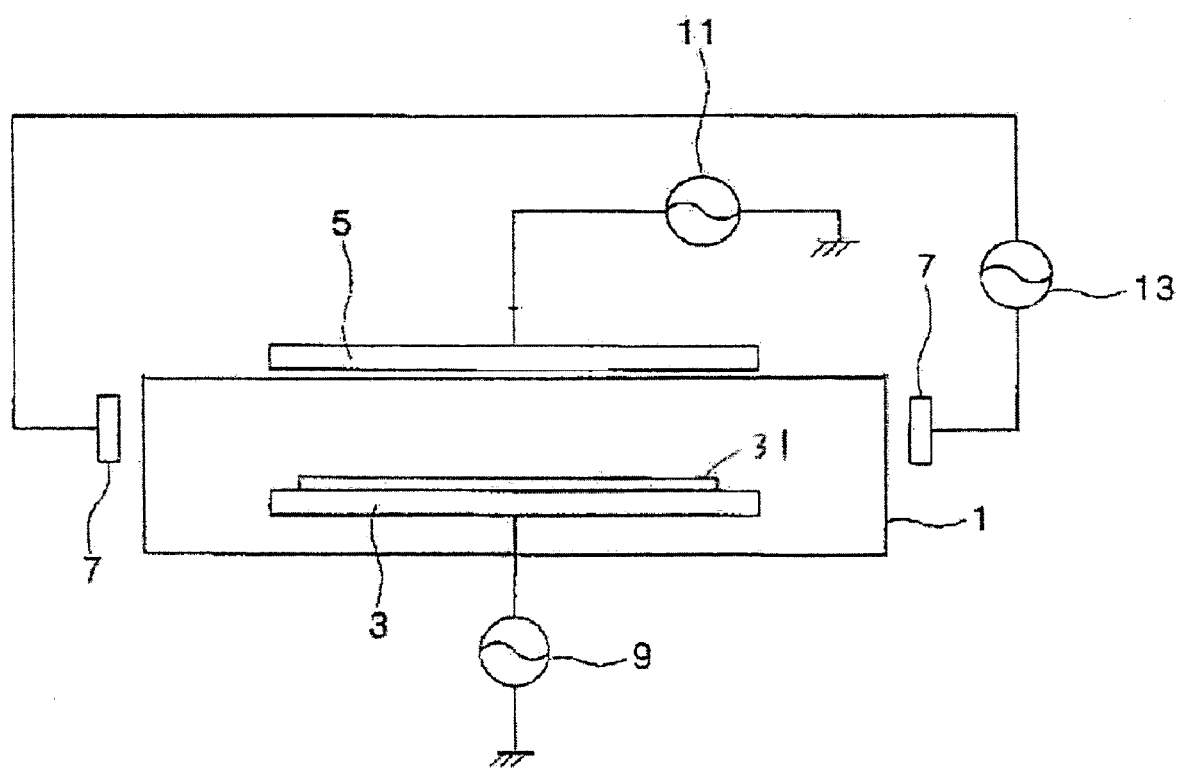
FIG. 1 is a diagram of a HDP-CVD plasma apparatus for use with an embodiment of the present invention.

The present invention concerns the deposition of a dielectric layer using high density plasma (HDP) chemical vapor deposition (CVD) techniques. The deposited layer has improved gap-fill capabilities as compared to the prior art HDP CVD methods.

In the following description, numerous specific details are provided. However, one skilled in the relevant art will recognize that the invention can be practiced without one or more of the specific details, or with other methods, components, materials, etc. In other instances, well-known structures, materials, or operations are not shown or described in detail to avoid obscuring novel aspects of the invention.

In general, HDP-CVD systems operate at lower pressure ranges (a few mTorr) than do low-density plasma systems. This is because such low pressure levels improve gap-fill results by increasing the mean free path of ions and dissociated species. This has been thought to increase the probability that such dissociated species will travel to the bottom of the trenches to assist in the important bottom-up deposition process. It has been known that the higher the chamber pressure, the more overhangs that result during the gap-fill process. Therefore, in most practically-employed HDP CVD processes, pressure levels have been kept to a minimum, for example, by even fully opening the throttle valve to achieve nearly zero pressure.

According to some embodiments of the invention, and in stark contrast to this zero-pressure trend, a HDP CVD dielectric layer, e.g., a gap-fill dielectric layer, is formed at a pressure range of from about 30 mTorr to about 90 mTorr within a process chamber.

Also, according to some embodiments of the present invention, the insulating layer is deposited on the substrate while a portion of the deposited insulating layer is concurrently etched, using a plasma and a process gas that includes a fluorine-containing gas at the above described pressure range. Preferably, a ratio of deposition to etching is from about 3:1 to about 10:1 during the concurrent deposition and etching.

In addition, according to some embodiments of the present invention, the process gas further comprises an inert gas, a silicon-containing gas, and an oxygen gas. Preferably, a ratio of a flow rate of the fluorine-containing gas to a flow rate of the silicon-containing gas is, e.g., less than about 0.9. More preferably, the flow rate ratio is from about 0.5 to about 0.9. Therefore, the ratio of the fluorine to silicon-containing gas flow rate is substantially reduced as compared to those of the prior art, e.g., 1, resulting in a substantially less fluorine content in the deposited gap-fill layers. This result can be obtained by, for example, increasing flow rates of the silicon-containing gas while maintaining the fluorine-containing gas flow rate.

Thus, by using a relatively higher chamber pressure compared to the conventional HDP CVD process, and by reducing a ratio of a flow rate of the fluorine-containing gas to a flow rate of the silicon-containing gas, or increasing the flow rate of the silicon-containing gas compared to the prior art, inclusion of fluorine atoms in the deposited layer can be substantially reduced while maintaining a sufficient fluorine-containing gas flow rate for good gap-fill results, as explained further below.

As a result, defects resulting from the unwanted inclusion of fluorine atoms can be prevented. Also, by combining the use of fluorine atoms with a relatively higher chamber pressure condition during the HDP CVD process, a number of processing steps can be significantly reduced while obtaining excellent gap-fill characteristics and fewer defects. Further, with some embodiments of the invention, gap-fill process margins are improved over the prior art such as the margin disclosed in the '745 invention. This is because the prior art problems discussed above such as voids and clipping of the substrate can be controlled more precisely.

FIG. 1 is a schematic diagram of one example of a HDP-CVD plasma apparatus that can be used with embodiments of the present invention. The HDP-CVD process chamber includes a chamber 1, a substrate support (or cathode, also referred to herein as a 'chuck') 3, an anode 5, and side electrodes 7. The cathode, anode and side electrodes are connected respectively to a bias radio frequency (RF) power source 9, a top RF power source 11 and a side RF power source 13, as is well-known in the art.

During the processing steps shown in FIGS. 2 through 6, the bias RF power, the top RF power, and the side RF power all are preferably in the range of about 1000 to about 10,000 Watts. However, embodiments of the present invention are not limited to these particular power conditions, but any other suitable power conditions can be used within the spirit and scope of the present invention. Moreover, the power ranges need not be the same among the bias, the top and the side power sources. This will be seen by reference to Tables 1 and 2 in which differentiated RF power ranges are employed to produce excellent results in accordance with the invention.

Figure 2:
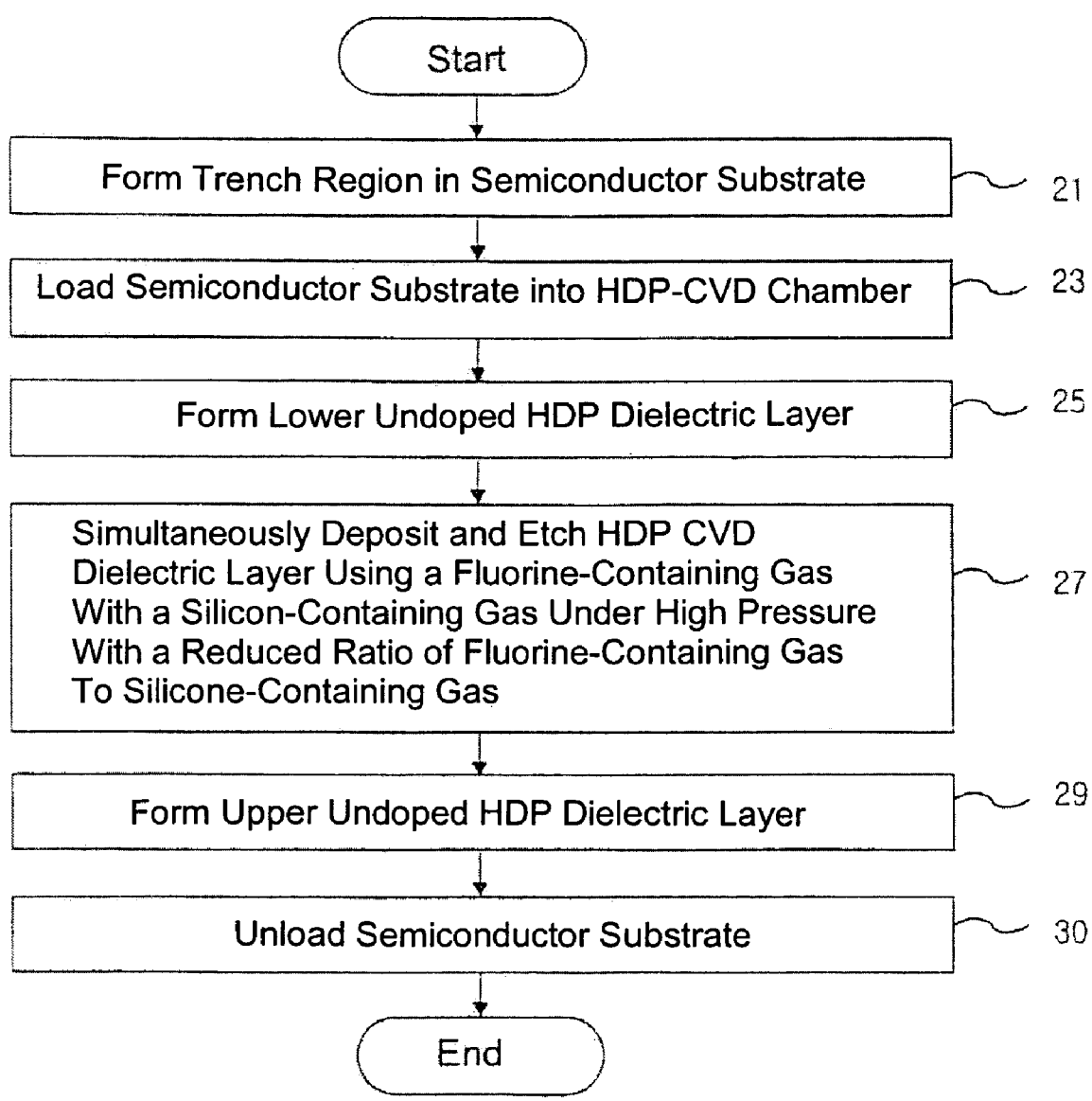
FIG. 2 is a process flowchart in accordance with an exemplary embodiment of the present invention.

FIG. 2 is a process flow chart in accordance with an exemplary embodiment of the invention, as will be explained below in conjunction with other drawings.

Figure 3:
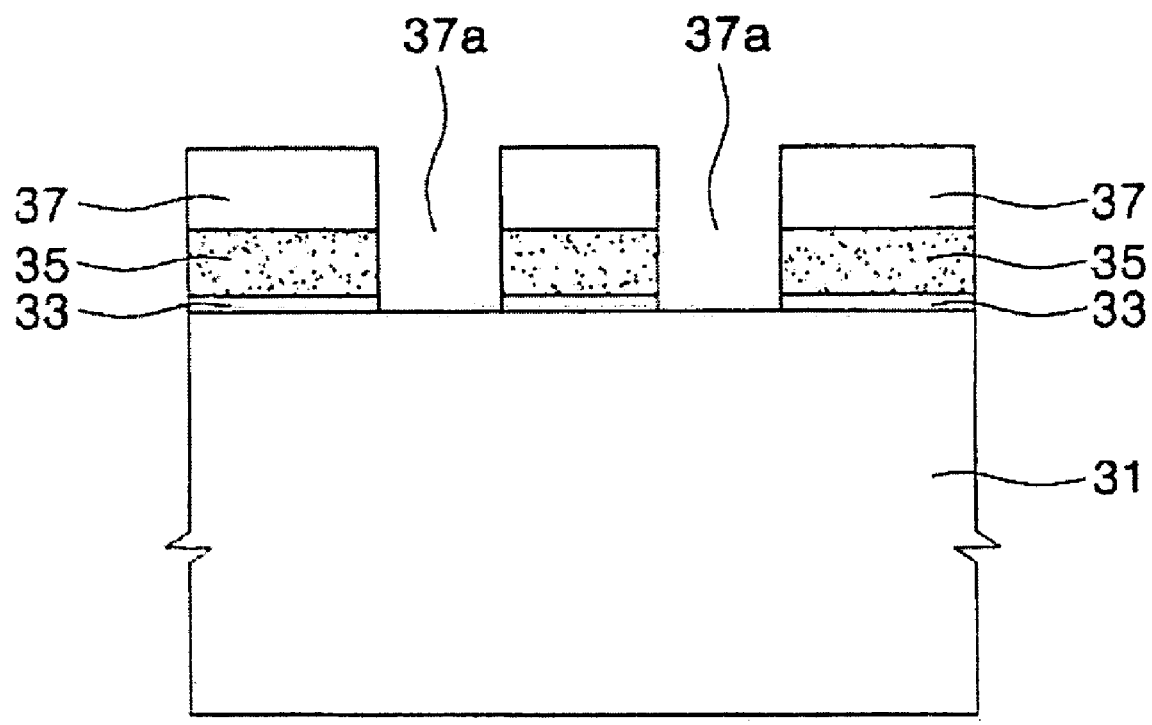
FIGS. 3 through 6 are cross-sectional views illustrating a process for fabricating trench isolations using HDP-CVD according to an exemplary embodiment of the invention.

Referring to FIG. 3, a pad oxide pattern 33, a pad nitride pattern 35 and a hard mask pattern 37 are formed on a semiconductor substrate 31, as shown. Those of skill in the art will appreciate that the pad oxide, pad nitride and hard mask patterns can be conventionally formed by sequentially applying a pad oxide layer (already partially removed by patterning in FIG. 3), a pad nitride layer (also not completely shown) and a hard mask layer (also not completely shown) to the semiconductor substrate 31 such as a silicon substrate, silicon on insulator (SOI), GaAs substrate, or SiGe substrate. The pad oxide layer and the pad nitride layer can be a thermal oxide film and a silicon nitride film, respectively. The hard mask layer can be a CVD silicon oxide. After their application, the hard mask layer, the pad nitride layer, and pad oxide layer are sequentially patterned to form one or more openings 37a extending therethrough.

Figure 4:
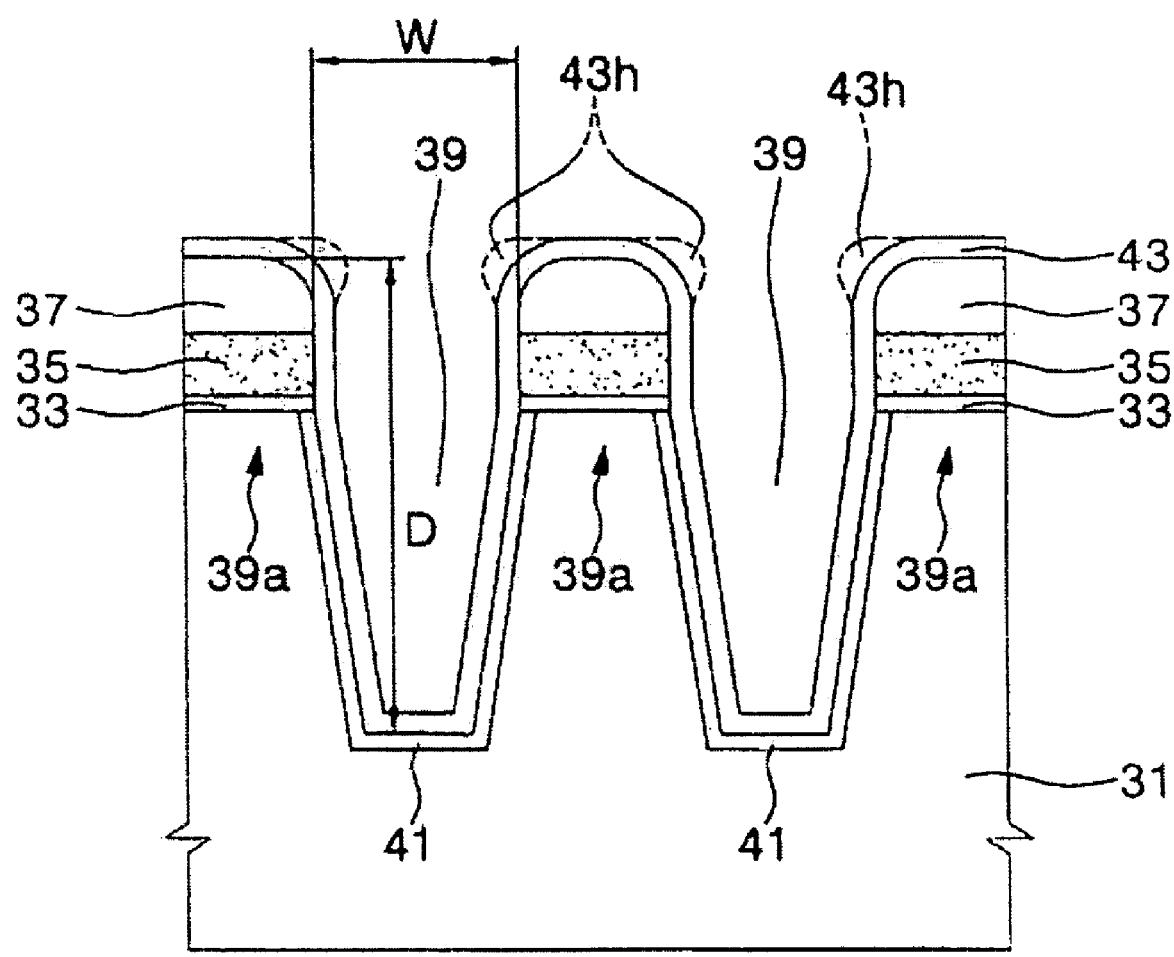

Referring to FIG. 4, trenches 39 are formed by etching a portion of the substrate 31 using the hard mask pattern 37 as an etching mask, thereby defining active regions 39a on the substrate 31 (step 21 of FIG. 2). Preferably, the trench 39 has an aspect ratio of at least 4 as defined by D (depth)/W (width) of the trench 39. The thermal oxide layer 41 is formed by oxidizing sidewalls of the trench 39. The thermal oxide layer 41 cures etch damage in the trench sidewall during etching of the semiconductor substrate 31 to form the trenches 39.

Referring again to FIG. 1, the semiconductor substrate 31 having the trench 39 is loaded into the chamber 1, particularly on the chuck 3, as shown (step 23 of FIG. 2).

Next, the process chamber 1 is evacuated using a vacuum pump (not shown), thereby creating a vacuum within the process chamber 1. The RF power sources 9, 11, 13 are turned on to supply one or more RF power levels to the chuck 3, the top electrode 5 and side electrodes 7, respectively.

Still referring to FIG. 4, a lower undoped HDP-CVD dielectric layer, e.g., HDP CVD oxide layer 43, is formed on the thermal oxide layer 41 using conventional techniques. The thickness of the HDP CVD oxide layer may be no greater than about 500 angstroms (500 Å). This processing step is performed for a time period of about 0 to about 20 seconds. The lower undoped HDP-CVD oxide layer 43 is believed to act as a buffer layer that prevents fluorine atoms, e.g., free radicals, within a fluorine-containing gas from attacking the substrate 31 in the subsequent processing step, i.e. 27 of FIG. 2. Accordingly, the lower, undoped HDP-CVD oxide layer 43 is deposited without fluorine atoms ("undoped"). The HDP CVD oxide layer 43 can be an un-doped silicate glass (USG) layer, but other suitable conventional dielectric materials such as borophosphosilicate glass (BPSG) alternatively can be used, within the spirit and scope of the invention.

Figure 5:
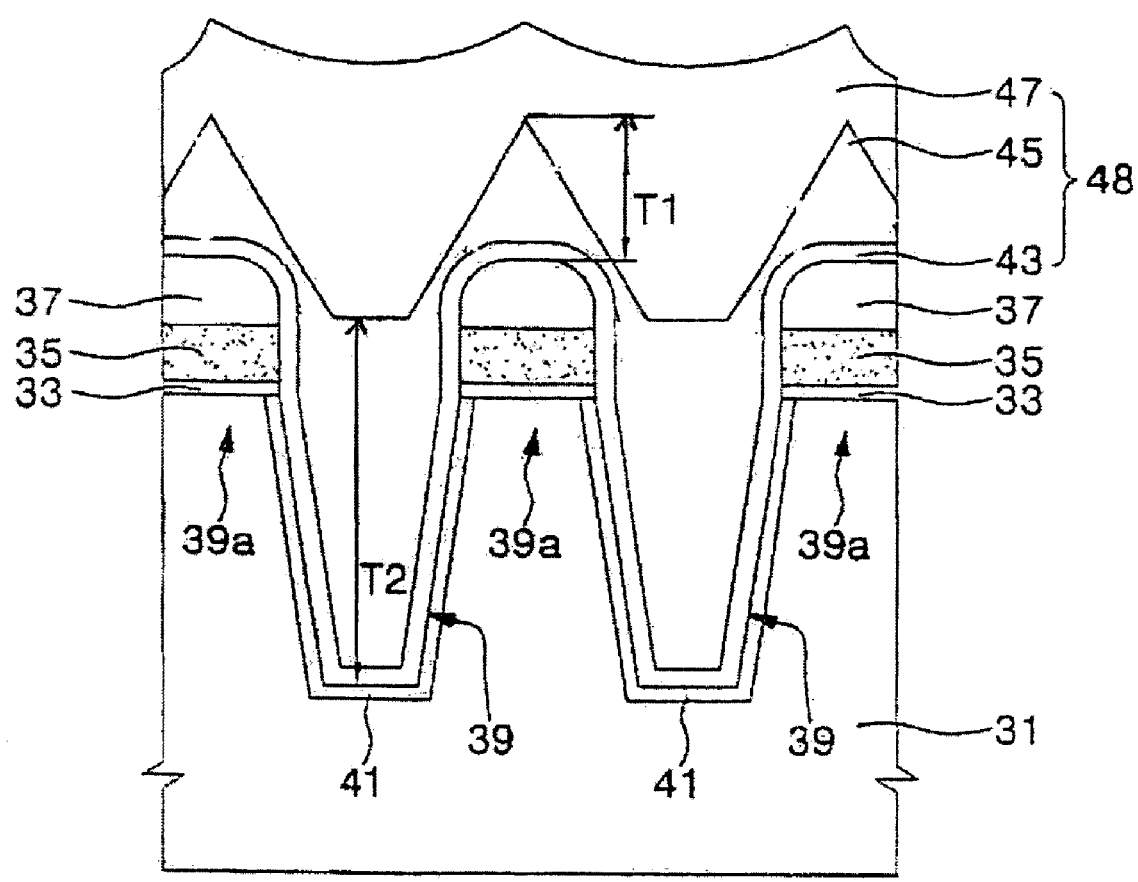

Referring to FIG. 5, deposition and etching processes are concurrently performed to form a main HDP CVD dielectric layer, e.g., HDP CVD oxide layer 45 overlying the lower undoped HDP-CVD oxide layer 43. The main HDP-CVD oxide layer 45 is configured with a ridge portion of a first thickness T1 on the hard mask layer 37 over the active region 39a, and a gap-fill portion of a second thickness (T2) in the region of the trench 39 (wherein T2 approximately represents the overall or average thickness of the main HDP CVD oxide layer 45, as can be seen from FIGS. 5 and 6).

The main HDP CVD oxide layer 45 is formed by introducing a gas mixture comprising a silicon-containing gas, a fluorine-containing gas, an inert gas such as Ar or He, and an oxygen gas into the chamber 1 through an inlet (not shown) and by maintaining a high-density plasma therein (step 27 of FIG. 2).

As for the silicon-containing gas, it can include, but is not limited to, a silane ($SiH_4$) gas or a disilane ($Si_2H_6$) gas. Other known silicon sources such as TEOS (tetraethyl orthosilicate) can be used. Also, as for the fluorine-containing gas, it can include, but is not limited to, $NF_3$, $CF_4$, $F_2$, $C_2F_6$, $CH_2F_2$, and $SiH_2F_2$. In short, any suitable silicon-containing and fluorine-containing gases are contemplated and are within the spirit and scope of the invention.

During the processing step 27 of FIG. 2, different gas species included in the process gas mixture react with one another inside the process chamber 1. For example, during the concurrent deposition and etching processing step, the deposition is performed by interactions among, for example, $SiH_4$, $NF_3$, $H_2$, He, and $O_2$ from the gas mixture. Also, during this processing step, the etching is performed by interactions among, for example, $NF_3$, $H_2$, He, and $O_2$ from the gas mixture. In particular, the etching is performed by both the chemical etching and physical etching processes. The chemical etching process is performed by the fluorine-containing gas such as $NF_3$ and the physical etching is performed by $H_2$, He, and $O_2$.

Thus, a deposition process and an etching process can be concurrently performed on the semiconductor substrate 31, thereby forming the main HDP-CVD dielectric layer 45. This concurrent processing step may be performed for a time period of about 60 to about 120 seconds such that the top surface of gap-fill portion of the main HDP CVD oxide layer 45 is higher than the top surface of the pad nitride pattern 35, in accordance with one embodiment of the invention.

Figure 7:
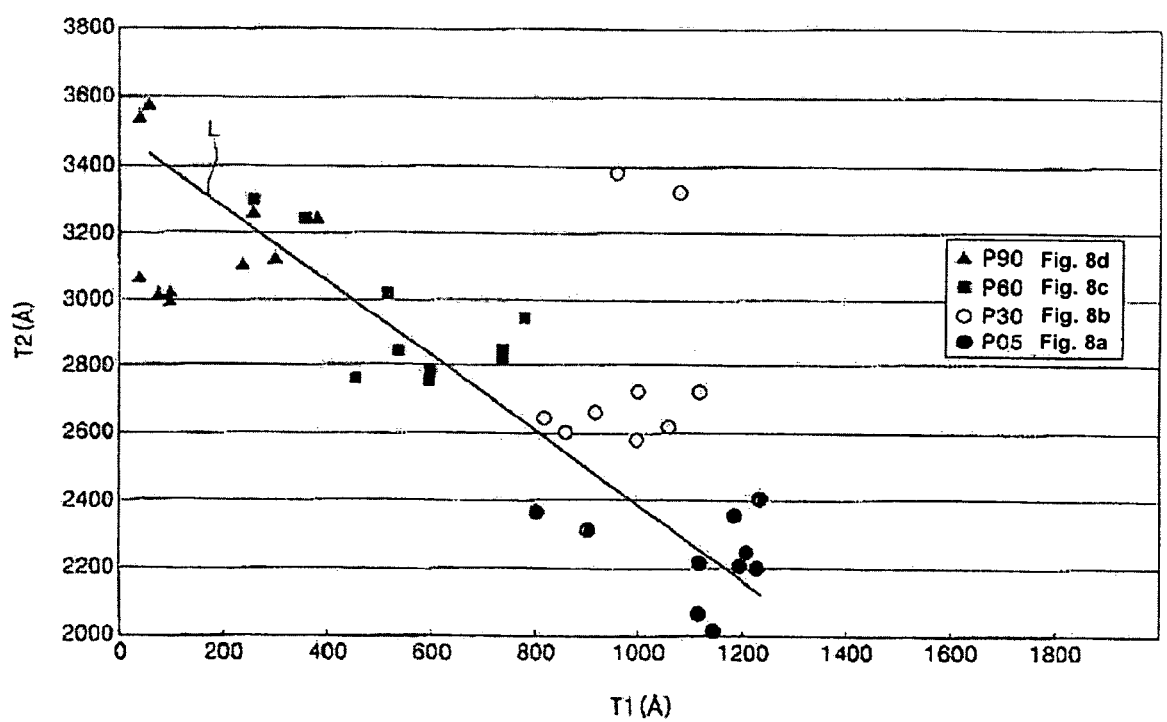
FIG. 7 is a graph illustrating experimental results of sample produced conventionally (lower right) and three samples produced using some embodiments of the invented method, under process conditions described in Table 1.
Figure 8:
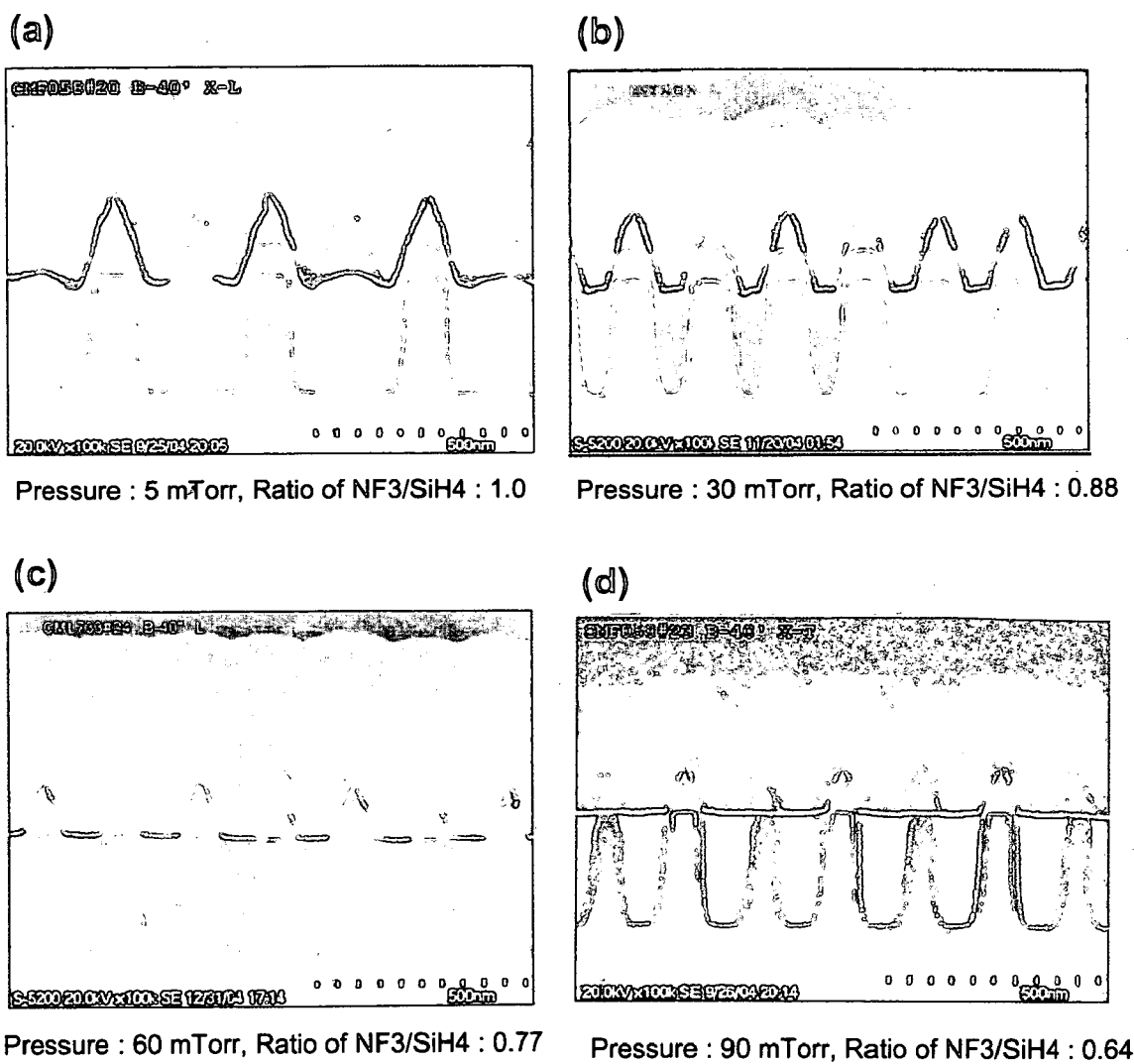
FIG. 8(a) through (d) are scanning electron microscope (SEM) photographs of the gap-fill structures in cross section also using the process conditions described in Table 1.
Figure 10:
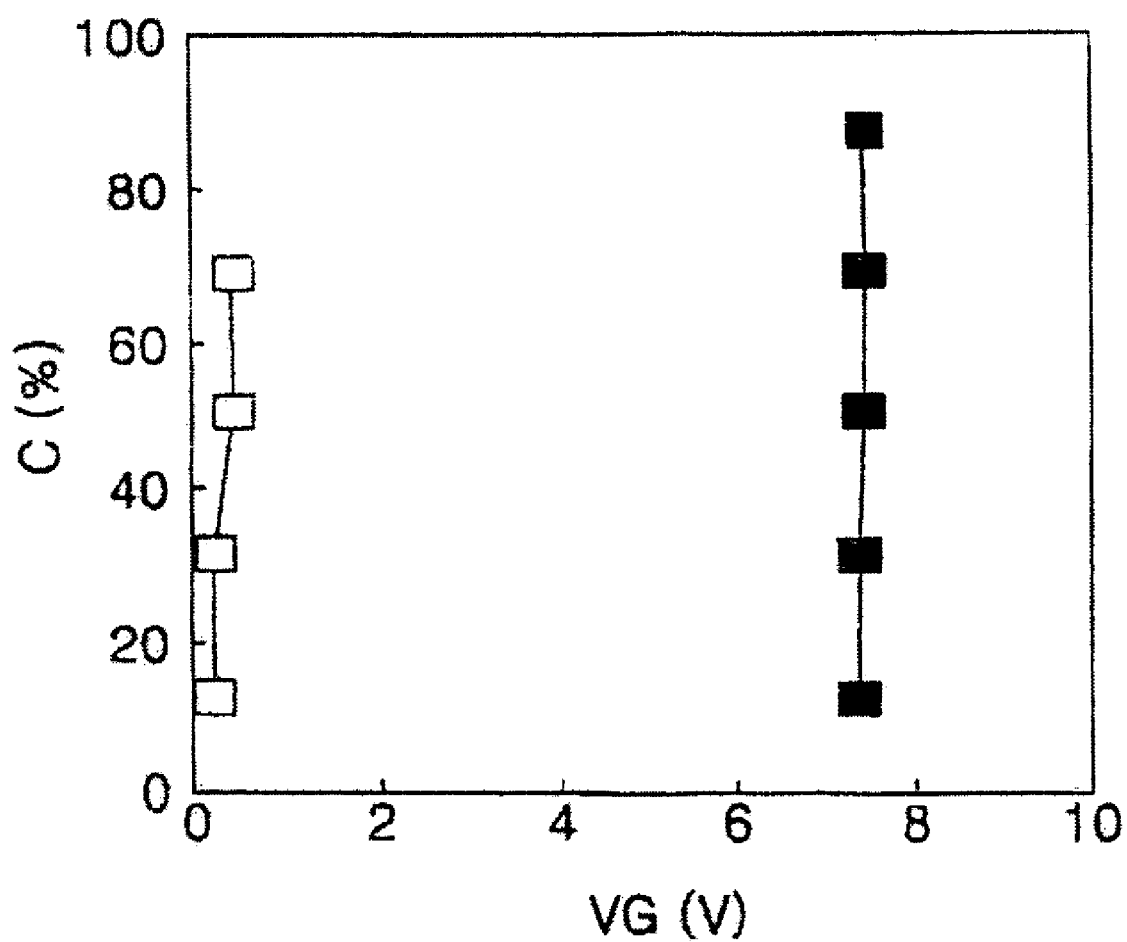
FIG. 10 is a graph illustrating the contrast between low-leakage current device yield for the conventional process (left) and the invented process (right), the graph representing gate voltage (horizontal axis) v. the cumulative distribution percentages of unacceptably high leakage current.

As briefly discussed above, during this processing step 27 of FIG. 2, the chamber pressure is maintained between about 30 mTorr and about 90 mTorr. As a result, unexpected and excellent gap-fill results are obtained (FIGS. 7, 8 and 10). Also, according to an aspect of the invention, the ratio of the fluorine-containing gas to the silicon-containing gas is substantially reduced compared to the prior art. Preferably, the ratio of the flow rate of the fluorine-containing gas and the flow rate of the silicon-containing gas is less than 0.9, e.g., from about 0.5 to about 0.9. This in turn reduces the defects resulting from unwanted fluorine atoms included in the HDP-CVD oxide layer 43.

According to one embodiment of the present invention, the process gas mixture may further include a hydrogen gas. During the concurrent deposition and etching processing step 27 of FIG. 2, the hydrogen gas is added to the gas mixture such that fluorine atoms from the fluorine-containing gas such as $NF_3$ can be additionally removed. As a result, the fluorine atoms included in the deposited HDP CVD dielectric layer 45 can be significantly reduced, which in turn reduce the defects in the resulting semiconductor device. Preferably, the ratio of the flow rate of the hydrogen gas to the flow rate of the fluorine-containing gas is at least about 5:1 during the concurrent deposition and etching processes. Maintaining this flow rate ratio effectively removes the fluorine atoms from the HDP-CVD dielectric. More preferably, the hydrogen to fluorine gas flow ratio is about 9:1, for example, the flow rate of the $H_2$ being about 500 standard cubic centimeters per minute (sccm) and the flow rate of the $NF_3$ being about 57 sccm.

As discussed above, according to one aspect of the invention, etching (including sputtering) and deposition take place concurrently. However, the deposition is a more dominant process compared to the etching to form a substantially thick, not incidental, dielectric layer during the processing step 27 of FIG. 2. Therefore, as discussed above, the top surface of gap-fill portion of the main HDP CVD oxide layer 45 may be higher than the top surface of the pad nitride pattern 35.

Preferably, the ratio of deposition to etching is from about 3:1 to about 10:1. More preferably, the ratio of deposition to etching is about 5:1 (e.g., 1700 angstroms (1700 Å): 350 angstroms (350 Å)), which has been found to produce good gap fill without forming voids. The deposition amount is defined as the volume of deposited material using a gas comprising $SiH_4$, $NF_3$, $H_2$, He, and $O_2$ for a period of 60 seconds. The etching amount is defined as the volume of deposited material being etched using a gas comprising $NF_3$, $H_2$, He, and $O_2$ for 60 seconds.

If the deposition amount increases, T1 (FIG. 5) increases and T2 decreases, which is undesirable for good gap fill. On the other hand, if the etching amount increases, T1 decreases and T2 increases, which is desirable from a gap-fill perspective. In other words, the more the etching, the better the gap-fill characteristics, but only to a limit. If the etching is excessive, then defects such as clipping, bubbles, and damage to the silicon active region due to excessive fluorine atoms can occur. Conversely, if the deposition is excessive, then the gap-fill characteristics become worse because voids are generated within the trench due to premature closing of the trenches 39, as discussed above. Therefore, an appropriate deposition/etching (D/E) ratio is important to a good gap-fill process, i.e., good gap-fill characteristics or increased gap-fill margins. With the present invention, control of the D/E ratio is much easier compared to the prior art, thereby increasing the reliability of the HPD CVD-manufactured semiconductor devices.

The thickness of the main HDP CVD dielectric layer 45 may be greater than about 1500 angstroms (1500 Å) and less than about 4000 angstroms (4000 Å), while the thickness of the lower undoped HDP CVD dielectric layer 43 may be no less than about 500 angstroms (500 Å), which nevertheless is substantially thinner than the main HDP CVD dielectric layer 45.

The lower, undoped HDP CVD dielectric layer 43 can include overhangs (43h of FIG. 4) at the upper portions or corners of the trenches 39. Such overhangs are chemically etched by fluorine ions or radicals from the fluorine-containing gas from the gas mixture discussed above. In addition, the overhangs can be physically etched, e.g., sputtered by inert gas ions such as Ar ions. Therefore, a physical etching process can be concurrently performed with a chemical etching process during the processing step 27 of FIG. 2. As a result, the subsequently deposited HDP-CVD oxide layer 45 as shown in FIG. 5 can be formed, without voids or other defects, on the substrate 31.

According to another aspect of the invention, the formation of the lower undoped HDP CVD dielectric layer 43 on a bottom portion of the trench 39 and the formation of the main HDP CVD oxide layer 45 overlying the lower undoped HDP CVD dielectric layer 43 can be performed in situ, i.e., in the same chamber, substantially saving processing time and increasing throughput.

Still referring to FIG. 5, an upper, undoped HDP-CVD dielectric layer, e.g., oxide layer 47 is formed on the main HDP-CVD oxide layer 45 (step 29 of FIG. 2). The thickness of the upper undoped HDP CVD oxide layer 47 may be greater than about 1000 angstroms (1000 Å) and less than about 4000 angstroms (4000 Å). This processing step may be performed for a time period of about 30 to about 120 seconds. The upper, undoped HDP CVD oxide layer can be formed of a material similar to that of the lower, undoped HDP CVD oxide layer 43 using a similar process.

Accordingly, a HDP-CVD oxide layer 48 may be seen to include the lower, undoped HDP-CVD oxide layer 43, the main, HDP-CVD oxide layer 45, and the upper, undoped HDP-CVD oxide layer 47.

Figure 6:
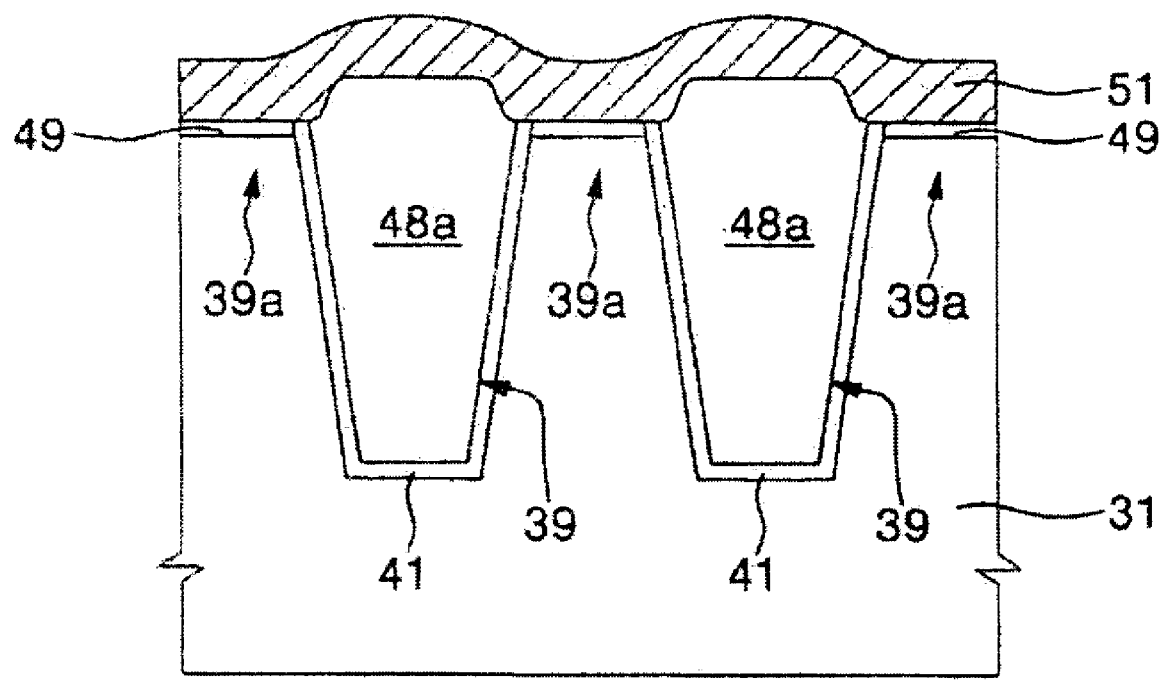

Referring to FIG. 6, the pad nitride pattern 35 is exposed by planarizing the HDP-CVD oxide layer 48, thereby forming the isolation layer 48a. Next, the active region 39a is exposed by removing pad nitride pattern 35 and pad oxide pattern 33. Next, a gate dielectric layer 49 is formed over the active regions 39a, as shown. Then, an electrode layer 51 is formed on the exposed active region 39a.

Subsequently, the substrate 31 having the HDP-CVD oxide layer 48 is unloaded from the process chamber (step 30 of FIG. 2).

Additional device structures subsequently can be formed, to complete semiconductor device or package fabrication, as known in the art.

Referring to FIG. 7, data sets represented by the symbols ○, ■, ▲, ●, are actual measurement results of samples fabricated in accordance with three embodiments of the present invention (1), (2) and (3) (Table 1) and those of another samples made in accordance with the conventional method, respectively. Particularly, Table 1 represents the conventional method in the left column and in FIG. 7 the ● symbols represent the experimental results, which are skewed to the far lower right of the T1 (horizontal axis) v. T2 (vertical axis) graph. Table 1 represents the invented method in the right three columns and in FIG. 7 the ○, ■, and ▲ symbols represent the experimental results, which are progressively clustered upwardly and leftwardly on the graph.

Those of skill in the art will appreciate that the graph thus illustrates the range of possibilities for the T2:T1 ratio, which as discussed above is preferably high. The cluster of data represented by the ●'s thus represents consistently relatively lower T2:T1 ratios; the cluster of data represented by the ○'s represents consistently moderately higher T2:T1 ratios; the cluster of data represented by the ■'s represents consistently more acceptably higher T2:T1 ratios; and the cluster of data represented by the ▲'s consistently represents the highest measured T2:T1 ratios. Those of skill in the art will appreciate by studying Table 1 below that the progressively superior results are consistent, in accordance with the invention, with progressively higher chamber pressures ranging from 5 mTorr to 90 mTorr and $SiH_4$:$NF_3$ flow rate ratios (i.e., progressively lower $NF_3$:$SiH_4$ flow rate).

TABLE 1

| Process Parameter | Conventional method | Present invention 1 | Present invention 2 | Present invention 3 |
|---|---|---|---|---|
| Pressure | 5 mTorr | 30 mTorr | 60 mTorr | 90 mTorr |
| Top RF Power | | 7000 W | | |
| Side RF Power | | 4000 W | | |
| Bias RF Power | | 3750 W | | |
| $SiH_4$ Flow | 57 sccm | 65 sccm | 74 sccm | 89 sccm |
| $NF_3$ Flow | | 57 sccm | | |
| $H_2$ Flow | | 500 sccm | | |
| He Flow | | 300 sccm | | |

TABLE 1-continued

| Process Parameter | Conventional method | Present invention 1 | Present invention 2 | Present invention 3 |
|---|---|---|---|---|
| $O_2$ Flow | 102 sccm | 116 sccm | 133 sccm | 160 sccm |
| Ratio of $NF_3/SiH_4$ | 1.0 | 0.88 | 0.77 | 0.64 |

Accordingly, as evidenced by FIG. 7 and Table 1, the higher the chamber pressure, e.g., 90 mTorr, the better the gap-fill characteristics, e.g., a higher T2:T1 ratio (while reducing the ratio of $NF_3/SiH_4$). This is explained in further detail below.

With the conventional HDP-CVD, which does not employ a chemical etching gas such as $NF_3$, as the chamber pressure is increased, the gap-fill capabilities are degraded for the reasons discussed above, e.g., a decreased mean free path.

However, according to some embodiments of the present invention, for HDP-CVD methods using a chemical etching gas such as an $NF_3$ gas, gap-fill capabilities are improved as the chamber pressure is increased, in contrast with the conventional HDP CVD. Although applicants do not wish to be held to a particular theory of operation, applicants believe that this is because fluorine species exhibit better isotropic etching characteristics, e.g., by removing the deposited material in the area of the trench openings, as the HDP CVD chamber pressure increases.

Also, in general, to improve gap-fill characteristics, a flow rate of the chemical etching gas such as $NF_3$ needs to be increased. However, increasing the fluorine-containing etching gas flow rate may cause the fluorine content in the HDP CVD gap-fill layer to increase, generating defects in active regions or in a gate dielectric layer, which in turn degrades the device characteristics and the reliability.

In accordance with an aspect of the present invention, excellent gap-fill results and a low fluorine content of the gap-fill layer can be obtained by, for example, increasing the chamber pressure and/or reducing the ratio of a flow rate of chemical etching gas, e.g., a fluorine-containing etching gas, to a flow rate of the silicon-containing gas. The reduction of the fluorine to silicon-containing gas flow ratio may be accomplished by, for example, increasing the silicon-containing gas flow rate to a level greater than, e.g., 65 sccm while maintaining the flow rate of $NF_3$ at, e.g., 57 sccm as shown in Table 1.

If only the chamber pressure is increased and the fluorine to silicon-containing gas flow ratio, e.g., $NF_3/SiH_4$, remains unchanged, then the deposition rate of the gap-fill layer inevitably decreases. However, by increasing the silicon-containing gas flow rate while at least maintaining the fluorine-containing gas flow rate, the deposition rate does not decrease but the fluorine content in the deposited gap fill layer can still be decreased. Therefore, fewer fluorine atoms invade the gap-fill dielectric layer with embodiments of the present invention.

Such is further evidenced in FIG. 8(a) through (d), SEM photographs that show intermediate trench isolation structures with partially deposited HDP CVD dielectric layers corresponding to the conventional method and the three embodiments of the invention, from left to right, according to process conditions listed in Table 1 above. In particular, with the sample formed with the conventional process condition disclosed in FIG. 8(a), i.e., the pressure at 5 mTorr, a ratio of $NF_3/SiH_4$ being 1.0, sharp ridges are visible over the active region 39a, i.e., these samples exhibit a lower, less desirable T2:T1 ratio. With the samples formed with the invented process conditions disclosed in FIG. 8(b)–(d), the samples no such sharp ridges are visible, i.e., these samples exhibit a higher, more desirable T2:T1 ratio. Such semiconductor devices made consistent with the invented method thus are characterized by good gap-fill characteristics and substantially no defects resulting from invading fluorine atoms. Also, see FIG. 10.

Those of skill in the art will appreciate that the line L in FIG. 7 is a linear approximation of the average of all samples, suggesting a straight-line progressive improvement as the $NF_3:SiH_4$ flow rate ratio decreases and as the chamber pressure increases, consistent with the invention.

Figure 9:
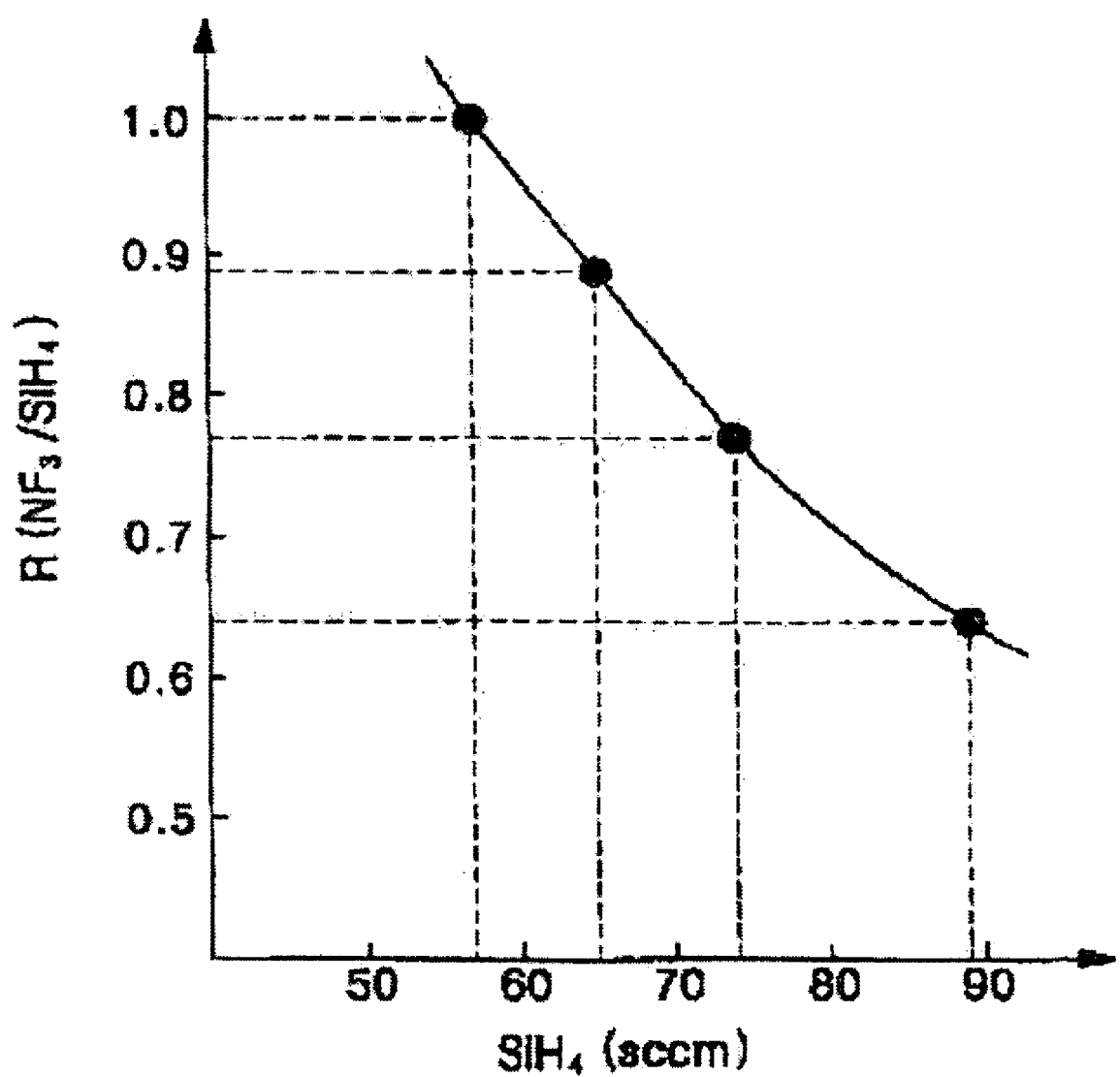
FIG. 9 is a graph illustrating the relationship between the flow rate of $SiH_4$ (horizontal axis) v. the ratio between the flow rates of $NF_3$ to $SiH_4$ (vertical axis), also using the process conditions described in Table 1.

FIG. 9 is a graph showing a relative flow rate ratio of $NF_3$ to $SiH_4$, with the horizontal axis representing the flow rate of $SiH_4$ and with the vertical axis representing the ratio (R) of $NF_3$ to $SiH_4$. The data points, from left to right and top to bottom, approximately correspond with the left, center-left, center-right and right columns of Table 1. According to one aspect of the present invention, the silicon-containing gas comprises $SiH_4$ the flow rate of which may be greater than about 65 sccm such that the ratio R is less than 0.9.

FIG. 10 is a graph showing electric characteristics of the gate oxide of a semiconductor device having a trench insulator structure using a HDP-CVD oxide layer.

Data represented by the symbol □ in FIG. 10 are measurement results of sample A, which is made by a conventional process listed in Table 2 below, and data represented by the symbol ■ in FIG. 10 are measurement results of sample B made under process conditions listed in Table 2 below. In particular, sample A is formed using low chamber pressure, i.e., 5 mTorr, and a high ratio of $NF_3$ to $SiH_4$, i.e., 1.14. Sample B is formed using higher chamber pressure, e.g., 30 mTorr and a low ratio of $NF_3$ to $SiH_4$, i.e., 0.88.

The horizontal axis of the graph of FIG. 10 represents gate voltage (Vg) and the vertical axis of the graph of FIG. 10 represents cumulative distribution rate (C) of samples exhibiting gate leakage currents in excess of 10 nA. Those of skill in the art will appreciate that the conventional samples nearly all failed after serial applications of relatively low gate voltages of less than 1 volt, whereas the invented samples began to fail only after applications of relatively high gate voltages of more than 7 volts.

TABLE 2

| Process Parameter | Sample A | Sample B |
|---|---|---|
| Pressure | 5 mTorr | 30 mTorr |
| Top RF Power | 7000 W | |
| Side RF Power | 4000 W | |
| Bias RF Power | 3750 W | |
| $SiH_4$ Flow | 57 sccm | 65 sccm |
| $NF_3$ Flow | 65 sccm | 57 sccm |
| $H_2$ Flow | 500 sccm | |
| He Flow | 300 sccm | |
| $O_2$ Flow | 102 sccm | 116 sccm |
| Ratio of $NF_3/SiH_4$ | 1.14 | 0.88 |

It can be concluded that the excellent electrical characteristics of the samples fabricated according to embodiments shown in the tables and graphs result from the fact that they completely filled narrow, high-aspect ratio trenches or gaps without defects resulting from invasive fluorine atoms while the samples formed according to the conventional process shown in Tables 1 and 2 left voids or have defects in the dielectric formed in the trenches or gaps.

The process parameters set forth above with respect to the experiments and different embodiments are optimized for particular deposition processes run in ULTIMA manufactured by Applied Materials. A person of ordinary skill in the art will recognize that these preferred parameters are, at least in part, chamber-specific and will vary if chambers of other design and/or volume are employed.

One of ordinary skill in the art can also use parameters and conditions other than those described with respect to specific embodiments. For example, while the invention described with respect to a silicon dioxide layer, the concept of the invention can also be used to improve the gap fill characteristics of phosphosilicate glass (PSG), boron-doped silicate glass (BSG) and boron phosphosilicate glass (BPGS) layers as well.

The method of the present invention is not limited to filling trenches such as shallow trench isolation STI features and may also be applied to other CVD processes such as depositing dielectric materials in interconnect applications where an insulating material is required between metal layers or signal wirings.

With such embodiments of the present invention, inclusion of fluorine atoms in the deposited layer can be substantially reduced, reducing defects resulting from the unwanted intrusion or invasion by fluorine atoms. Also, a number of processing steps can be significantly reduced while obtaining excellent gap-fill characteristics and fewer defects. Further, gap-fill process margins can be increased.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in a manner that is most helpful in understanding the invention. However, the order in which the steps are described does not imply that the operations are order-dependent or that the order that steps are performed must be the order in which the steps are presented.

Having described and illustrated the principles of the invention in several preferred embodiments, it should be apparent that the embodiments may be modified in arrangement and detail without departing from such principles. We claim all modifications and variation coming within the spirit and scope of the following claims.

The invention claimed is:

1. A method of manufacturing a semiconductor device, the method comprising:
   placing a semiconductor substrate with a trench in a chamber;
   forming a first insulating layer on a bottom of the trench;
   concurrently performing deposition and etching processes to form a gap-fill dielectric layer over the first insulating layer by introducing a gas mixture comprising a silicon-containing gas, a fluorine-containing gas, an inert gas, an oxygen gas, and also a hydrogen gas into the chamber under a high-density plasma condition at a pressure range of from about 30 mTorr to about 90 mTorr,
   wherein a ratio of a flow rate of the fluorine-containing gas to a flow rate of the silicon-containing gas is less than about 0.9.

2. The method of claim 1, which further comprises forming a second insulating layer over the dielectric layer.

3. The method of claim 1, wherein the first insulating layer comprises an oxide layer formed without using the fluorine-containing gas.

4. A method of manufacturing a semiconductor device, the method comprising:
   forming a trench in a semiconductor substrate;
   forming a first insulating layer on a bottom of the trench; and
   concurrently performing deposition and etching processes to form a gap-fill dielectric layer over the first insulating layer by using a plasma and a gas mixture comprising a silicon-containing gas, a fluorine-containing gas, an inert gas, an oxygen gas, and also a hydrogen gas at a pressure range of from about 30 mTorr to about 90 mTorr,
   wherein a ratio of a flow rate of the fluorine-containing gas to a flow rate of the silicon-containing gas is about 0.5 to about 0.9 and a ratio of a flow rate of the hydrogen gas to a flow rate of the fluorine-containing gas is at least about 5:1 during the concurrent deposition and etching processes.

5. The method of claim 4, which further comprises forming a second insulating layer over the dielectric layer.

6. The method of claim 4, wherein a thickness of the gap-fill dielectric layer is greater than about 1500 angstroms and less than about 4000 angstroms, wherein a thickness of the second insulating layer is greater than about 1000 angstroms and less than about 4000 angstroms, and wherein a thickness of the first insulating layer is no greater than about 500 angstroms.

7. The method of claim 4, wherein the silicon-containing gas comprises $SiH_4$, and wherein a flow rate of the $SiH_4$ is greater than about 65 sccm.

8. The method of claim 4, wherein the fluorine-containing gas includes a gas chosen from $NF_3$, $CF_4$, $F_2$, $C_2F_6$, $CH_2F_2$, and $SiH_2F_2$.

9. The method of claim 4, wherein the silicon-containing gas includes a gas chosen from $SiH_4$ and $Si_2H_6$.

10. The method of claim 4, wherein the pressure ranges from about 60 mTorr to about 90 mTorr.

* * * * *